United States Patent [19]

Nitta

[11] Patent Number: 5,798,537
[45] Date of Patent: Aug. 25, 1998

[54] BLUE LIGHT-EMITTING DEVICE

[75] Inventor: Koichi Nitta, Kanagawa-ken, Japan

[73] Assignee: Kabushiki Kaisha Toshiba, Kawasaki, Japan

[21] Appl. No.: 705,123

[22] Filed: Aug. 29, 1996

[30] Foreign Application Priority Data

Aug. 31, 1995 [JP] Japan .................. 7-223996

[51] Int. Cl.⁶ .................. H01L 33/00; H01S 3/18
[52] U.S. Cl. .................. 257/103; 257/96; 257/97; 257/99; 257/13; 257/749; 372/43
[58] Field of Search .................. 257/96, 97, 99, 257/13, 749, 103; 372/43

[56] References Cited

U.S. PATENT DOCUMENTS

| | | | |
|---|---|---|---|
| 4,495,514 | 1/1985 | Lawrence | 257/749 |
| 5,247,533 | 9/1993 | Okazaki | 257/13 |
| 5,369,289 | 11/1994 | Tawaki | 257/749 |
| 5,602,418 | 2/1997 | Imai | 257/96 |
| 5,652,438 | 7/1997 | Sassa | 257/96 |
| 5,656,832 | 8/1997 | Ohba | 257/43 |
| 5,670,798 | 9/1997 | Schetzina | 257/96 |

FOREIGN PATENT DOCUMENTS 5-63266  3/1993  Japan .

*Primary Examiner*—Jerome Jackson
*Attorney, Agent, or Firm*—Finnegan, Henderson, Farabow, Garrett & Dunner, L.L.P.

[57] ABSTRACT

There is disclosed a blue light emitting device having a laminated structure, which comprises a buffer layer made of a first conductivity type GaN-based semiconductor, a first cladding layer made of the first conductivity type GaN-based semiconductor, an active layer made of a substantially intrinsic GaN-based semiconductor, and a second cladding layer made of a second conductivity type GaN-based semiconductor, on a conductive substrate such as a conductive sapphire substrate. The GaN-based semiconductors of the present invention are made of quaternary compound semiconductor layers, and preferably made of $In_xA_yGa_{1-x-y}N$ whose mole fraction values x, y satisfy $0 \leq x \leq 1$, $0 \leq y \leq 1$ and $x+y \leq 1$. The mole fraction values x, y are selected to obtain desired luminous wavelength and intensity.

13 Claims, 5 Drawing Sheets

BLUE LIGHT-EMITTING DEVICE

BACKGROUND OF THE INVENTION

1. Field of the Invention

The present invention relates to a light-emitting device such as light emitting diode (LED) or semiconductor laser diode (LD) using a gallium nitride (GaN)-based III-V compound semiconductor and, more particularly, a blue light-emitting device.

2. Description of the Prior Art

In recent years, the GaN-based compound semiconductor such as GaN, $In_xGa_{1-x}N$, or $Ga_xAl_{1-x}N$ attracts attention as material for blue-LED or blue-emitting LD. With the use of this compound semiconductor (III-V nitrides), it has been feasible to emit a blue light which has been difficult to obtain until now. As the conventional blue light-emitting device, there has been the LED utilizing the GaN, as set forth in Patent Application Publication (KOKAI) 5-63266. A structure of such conventional LED is shown in FIG. 1. More particularly, a blue light-emitting device 2 consists of an n-type GaN semiconductor layer 202 and a p-type GaN semiconductor layer 203, both being laminated on a sapphire ($Al_2O_3$) substrate 100 via a buffer layer 201. The blue light can be emitted by injecting carriers into a pn junction formed between the n-type GaN semiconductor layer 202 and the p-type GaN semiconductor layer 203.

However, there has been a problem that luminous wavelength cannot be sustained by the blue light emitting device employing the GaN. There has been another problem of lattice matching between ternary semiconductor (such as $In_xGa_{1-x}N$ or $Ga_xAl_{1-x}N$) and the substrate and there was a limit in the variable range of the mole fraction x of the ternary semiconductor. Therefore, such drawbacks have arisen that the variable range of luminous wavelength is limited and intensity of the light to be generated is lowered when the wavelength is changed. For this reason, the fields to which such blue light emitting device is applicable would be restricted.

In addition, in the conventional GaN blue light-emitting device, the insulating sapphire substrate 100 must be employed to grow GaN layer thereon, then metal electrodes 205, 204 have to be formed on both surfaces of the n-type GaN semiconductor layer 202 and the p-type GaN semiconductor layer 203 respectively, and a trench is required so as to form the metal electrode 205 on the n-type GaN semiconductor layer 202, as shown in FIG.1, and then two electrodes 205, 204 have to be connected by wire bonding. However, since it is difficult to etch the GaN, complicated manufacturing steps are needed. Further, an entire size of the device cannot be reduced and thus manufacturing yield is lowered. Troublesome wire bonding must be conducted twice a device. Such problems are serious bars to integration of the light emitting device.

SUMMARY OF THE INVENTION

An object of the present invention is to provide a blue light emitting device capable of adjusting wavelength freely without reducing intensity of the light to be generated.

Another object of the present invention is to provide a blue light emitting device a chip size of which can be reduced.

Still another object of the present invention is to provide a blue light emitting device which may be manufactured by virtue of simple manufacturing steps.

Yet still another object of the present invention is to provide a blue light emitting device which is fitted for an integrated circuit.

In order to attain the above objects, the blue light-emitting device according to the present invention is characterized by comprising quaternary compound semiconductor layers shown in FIG.2. In other words, the blue light-emitting device such as LED according to the present invention has a laminated structure in which, on a conductive substrate 100 are formed in sequence a buffer layer 101 made of a first conductivity type GaN-based semiconductor, a first cladding layer 102 made of a first conductivity type GaN-based semiconductor, an active layer 103 made of a GaN-based semiconductor which is substantially intrinsic, i.e., in which impurity is not doped intentionally, and a second cladding layer 104 made of a second conductivity type GaN-based semiconductor which has opposite conductivity to the first conductivity. An upper electrode 105 is formed on the second cladding layer 104, while a lower electrode 106 is formed almost on the overall bottom surface of the conductive substrate 100. These GaN-based compound semiconductors are formed of quaternary compound semiconductor of $In_xAl_yGa_{1-x-y}N$. Respective mole fraction x, y are selected as predetermined values to satisfy $0 \leq x \leq 1$, $0 \leq y \leq 1$ and x+y 1. For example, the first conductivity type signifies n-type while the second conductivity signifies p-type conductivity. But the n-type and the p-type may be reversed. It is preferable that the conductive substrate 100 is a conductive sapphire ($Al_2O_3$) substrate.

According to a GaN-based blue light-emitting device according to the present invention, since four kinds of elements are included in the active layer 103, bandgap Eg of the active layer 103, i.e., light emitting characteristic can be varied considerably by adjusting component ratio of such elements while maintaining the lattice matching between the semiconductors and the sapphire substrate. Therefore, the crystal quality is excellent and luminous intensity can be kept constant or optimized. Furthermore, in a GaN-based blue light-emitting device according to the present invention, wire bonding for the upper electrode 105 may be conducted only once a device (chip), so that manufacturing steps can be significantly simplified. Moreover, in a GaN-based blue light-emitting device according to the present invention, since only one metal electrode contacting portion (upper metal electrode) 105 may be provided on an upper surface of the chip, high integration density can be implemented effectively.

Other and further objects and features of the present invention will be become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
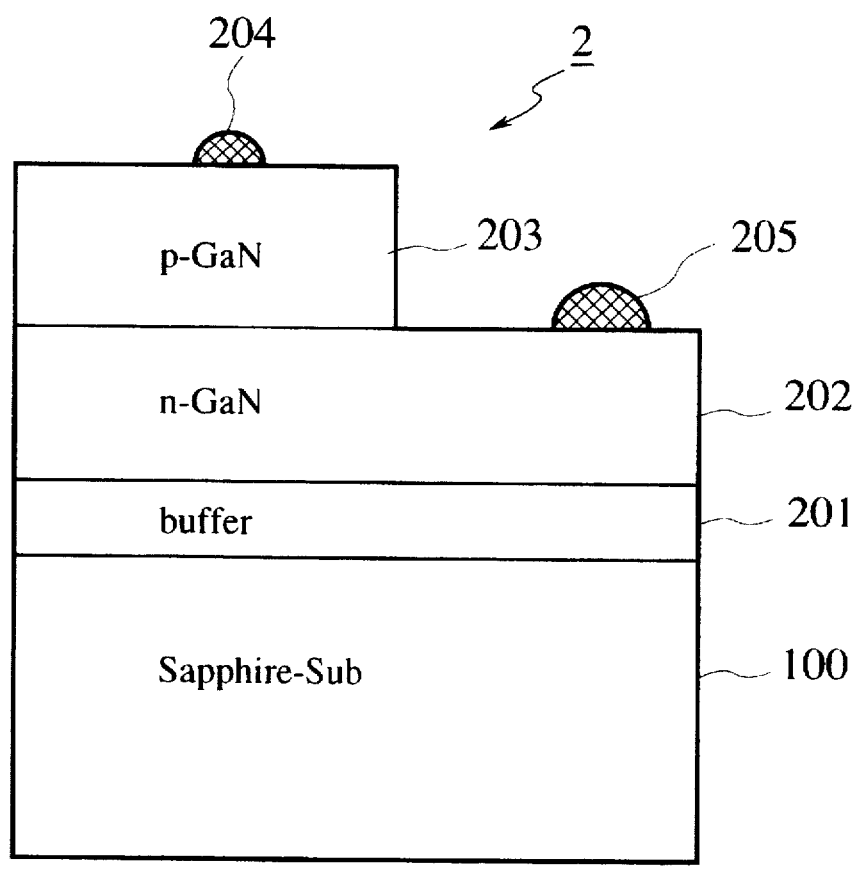
FIG. 1 is a schematic sectional view showing an example of a semiconductor blue LED in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor light-emitting devices, it will be appreciated that the various drawings are not drawn to scale from one figure to another nor inside a given figure, and in particular that the layer thickness are arbitrarily drawn for facilitating the reading of the drawings.

Figure 2:
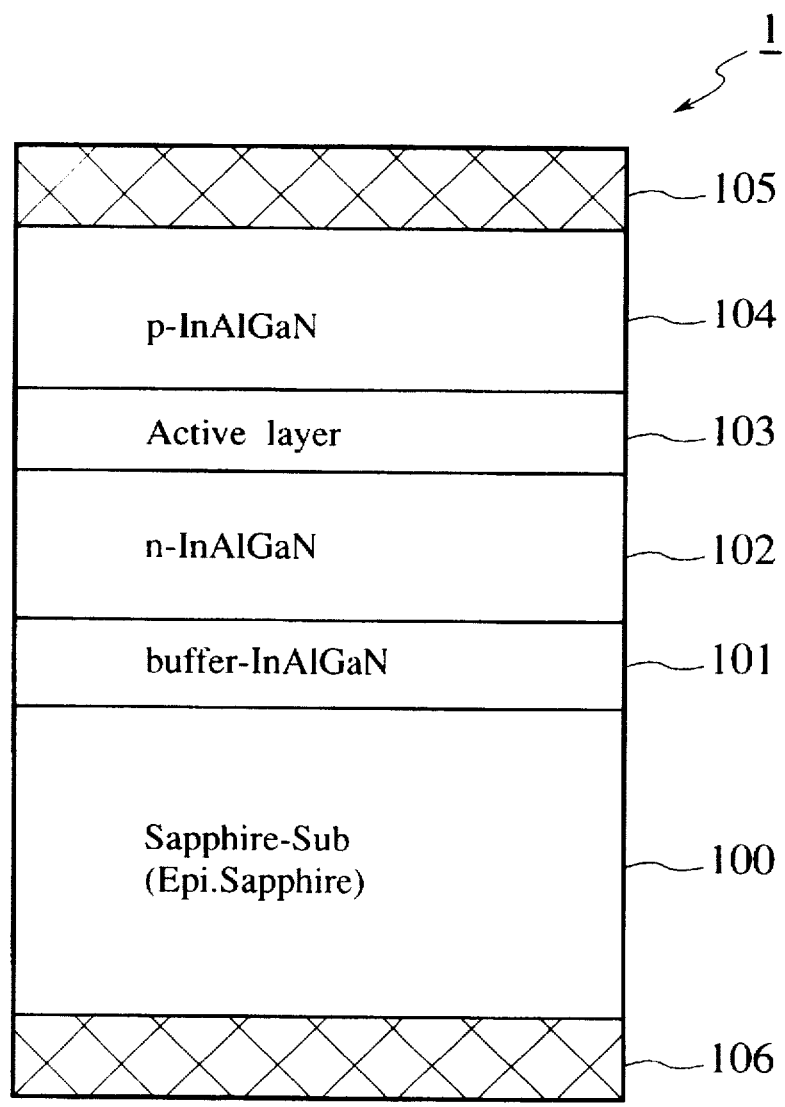
FIG. 2 is a sectional view showing a layer structure of a semiconductor chip of a GaN-based blue light-emitting device according to the present invention.

A gallium nitride (GaN) based compound semiconductor blue LED according to the present invention will be explained with reference to FIG. 2. The GaN-based blue LED 1 according to the present invention is manufactured as follows. On a conductive sapphire substrate 100 are formed in sequence a buffer layer 101 made of an n-type GaN-based semiconductor, a first cladding layer 102 made of an n-type GaN-based semiconductor, an active layer 103 made of a GaN-based semiconductor, and a second cladding layer 104 made of a p-type GaN-based semiconductor.

The conductive sapphire substrate 100 is an epitaxially grown substrate (epitaxial substrate). The epitaxial substrate is so formed that first an epitaxial layer is grown on the sapphire substrate prepared as a mother substrate by CVD method, which uses reaction gas including aluminum compound gas and oxygen compound gas or oxygen, using nitrogen as carrier gas, and then the sapphire mother substrate is removed to leave the epitaxial layer. In the present invention, during the growth of the sapphire substrate layer 100 by CVD method, the sapphire layer deposited is rendered conductive by introducing impurity elements such as group II, or group IV elements. In the blue emitting LED of the present invention, an n-side metal electrode 106 may be directly provided on a bottom surface of the substrate because the sapphire substrate 100 is made to be conductive. For the sake of obtaining low ohmic contact resistance between the sapphire substrate 100 and the metal electrode 106, it is preferable to form an n-type GaN-based semiconductor (contact layer) between the n-side metal electrode 106 and the sapphire substrate.

Because the metal electrode 106 is formed on the bottom surface of the sapphire substrate 100, another metal electrode 105 may be formed almost on the overall surface of the second cladding layer 104 made of the p-type GaN-based semiconductor. This may increase a light emitting area if these electrodes are supposed to have the same chip area. And it is preferable to form a contact layer made of p-type GaN-based semiconductor between the metal electrode 105 and the second cladding layer 104.

More particularly, it is preferable to use an $In_xAl_yGa_{1-x-y}N$ compound semiconductor as the GaN-based semiconductors. Where mole fraction values x, y satisfy $0 \leq x \leq 1$, $0 \leq y \leq 1$ and x+y 1. In the present invention, the green, blue-green, blue or UV light emission can be implemented in a wide spectral range by adjusting mole fraction values x, y.

Concrete examples of mole fraction are given in the following. The buffer layer 101 made of the n-type GaN-based semiconductor is provided to relax lattice mismatching between the first cladding layer 102 made of the n-type GaN-based semiconductor and the sapphire substrate 100. Respective mole fraction values of $In_xAl_yGa_{1-x-y}N$ are selected to be $0 \leq x \leq 1$, $0 \leq y \leq 1$, preferably $0 \leq x \leq 0.5$, $0 \leq y \leq 0.5$, for example. Impurity concentration is of $1 \times 10^{18}$ $cm^{-3}$.

The n-type GaN-based semiconductor layer 102 serves as the n-type cladding layer (first cladding layer). Respective mole fraction values of $In_xAl_yGa_{1-x-y}N$ used as the first cladding layer 102 may be adjusted appropriately in response to luminous wavelength to be generated. For example, the mole fraction values are selected to be $0 \leq x \leq 1$, $0 \leq y \leq 1$, preferably $0 \leq x \leq 0.3$, $0.1 \leq y \leq 1$. In order to obtain n-type conductivity, an impurity such as silicon (Si) or selenium (Se) is also doped. Impurity concentration is set to $5 \times 10^{18}$ $cm^{-3}$.

The active layer 103 made of the GaN-based semiconductor is a so-called "undoped" semiconductor layer in which impurity is not doped intentionally, and constitutes a central layer of the light emitting region. Although respective mole fraction values of $In_xAl_yGa_{1-x-y}N$ used as the active layer 103 may be adjusted appropriately correspondingly to luminous wavelength to be generated, they are selected to be $0 \leq x \leq 1$, $0 \leq y \leq 1$, preferably $0 \leq x \leq 0.5$, $0 \leq y \leq 0.6$, for example.

The p-type GaN-based semiconductor layer 104 is the p-type cladding layer (second cladding layer). In conjunction with the n-type cladding layer 102 and the active layer 103, respective mole fraction values of $In_xAl_yGa_{1-x-y}N$ used in the p-type cladding layer 104 may be adjusted suitably in compliance with luminous wavelength to be generated. For example, mole fraction values are selected to be $0 \leq x \leq 1$, $0 \leq y \leq 1$, preferably $0 \leq x \leq 0.3$, $0.1 \leq y \leq 1.0$. In order to achieve p-type conductivity, an impurity such as magnesium (Mg), beryllium (Be) or zinc (Zn) is doped. Impurity concentration is of $3 \times 10^{18}$ $cm^{-3}$.

The p side electrode layer (upper electrode) 105 is an electrode which is transparent to a light emitted from the active layer 103. More particular, although this electrode may be formed of a compound of metal and oxygen such as ITO (indium tin oxide) or $SnO_2$, it may be formed of a sufficiently thin metal. A contact layer of the p-type GaN-based semiconductor layer may also formed between the electrode 105 and the second cladding layer. In this event, respective mole fraction values in $In_xAl_yGa_{1-x-y}N$ contact layer are selected to be $0 \leq x \leq 1$, $0 \leq y \leq 1$, preferably $0.5 \leq x \leq 1.0$, $0 \leq y \leq 0.1$, for instance. In order to achieve p-type conductivity contact layer, an impurity such as magnesium (Mg), beryllium (Be) or zinc (Zn) is doped. Impurity concentration is of $5 \times 10^{18}$ $cm^{-3}$.

The n side electrode (lower electrode) 106 serving as another electrode is not always required to be transparent. The metal of Ti, Al, Ni, etc. can be employed as a material for the lower electrode. And if lower ohmic contact resistance is required, a contact layer may be formed between the metal electrode 106 and the sapphire substrate 100. For instance, this contact layer is formed of the n-type GaN-based semiconductor. In case the $In_xAl_yGa_{1-x-y}N$ is used as the n-type GaN-based contact layer, mole fraction may be adjusted appropriately correspondingly to luminous wavelength to be generated, they are selected to be $0 \leq x \leq 1$, $0 \leq y \leq 1$, preferably $0.5 \leq x \leq 1.0$, $0 \leq y \leq 0.1$, for example. In order to obtain n-type conductivity, an impurity such as silicon (Si) or selenium (Se) is also doped. Impurity concentration is of $8 \times 10^{18}$ $cm^{-3}$. It is of course that other conductive materials having good contact with the sapphire substrate 100 may be used.

In the above structure, respective mole fraction values of $In_xAl_yGa_{1-x-y}N$ are determined such that bandgaps of the n-type cladding layer 102 and the p-type cladding layer 104 is set to be larger than that of the GaN-based semiconductor active layer 103. According to the above structure, an amount of carriers which are to be injected into the active layer 103 may be increased effectively by confining carriers into the active layer 103, so that luminous intensity may be further improved.

Next, a method of manufacturing the blue LED according to the present invention will be explained with reference to FIGS. 3A to 3E and FIG.4 hereinbelow.

Figure 3A:
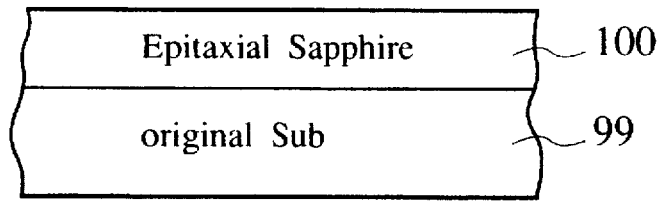
FIGS. 3A to 3E are sectional views illustrating steps of manufacturing the GaN-based blue light-emitting device according to the present invention.

(a) As shown in FIG. 3A, first a sapphire substrate 99 of 450 to 250 µm in thickness is prepared and then a sapphire film 100 is formed 80 to 150 µm thick on the substrate 99. The sapphire film 100 is grown by CVD method. In CVD method, the reaction gas consisting of aluminum compound gas such as $AlCl_3$, TMA, or TIBA and oxygen ($O_2$) or oxygen compound gas such as $CO_2$, $N_2O$ is employed together with the carrier gas such as nitrogen ($N_2$), helium (He), argon (Ar), etc. In this event, if an element in group IV, e.g., C, Si, Ge, Sn, or Pb are introduced as impurity in the sapphire substrate 100 together with reaction gas such as $AlCl_3$, TMA, $CO_2$, or $N_2O$, the sapphire film 100 is caused to have n-type conductivity. For purposes of example, if $SiH_4$, $GeH_4$, TMG is used selectively as impurity gas, Si, Ge, C can be doped respectively.

On the contrary, if an element in group II, e.g., Be, Mg, Ca, Sr, Ba, Ra, Zn, Cd, or Hg are introduced as impurity, the sapphire film 100 is caused to have p-type conductivity. This is because Al of $Al_2O_3$ in the sapphire is replaced with the element in group II or group IV. In the present invention, it is preferable that the sapphire film 100 has n-type conductivity and its resistivity is less than 1 Ω-cm.

Figure 3B:
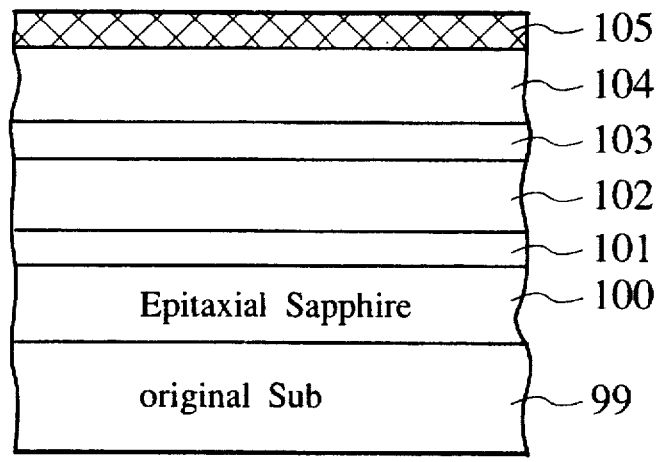

(b) As shown in FIG. 3B, on the sapphire substrate 100 are laminated by MO-CVD, etc. in sequence the n-type $In_xAl_yGa_{1-x-y}N$ buffer layer 101, the n-type $In_xAl_yGa_{1-x-y}N$ cladding layer 102, the non-doped $In_xAl_yGa_{1-x-y}N$ active layer 103, and the p-type $In_xAl_yGa_{1-x-y}N$ cladding layer 104. For the epitaxial growth of these layers, the high frequency (RF) induction heating type atmospheric pressure CVD (APCVD) furnace is employed, and the sapphire substrate 99 having the sapphire film 100 thereon is placed in the growth chamber of the CVD furnace, and then the reaction gas including metalorganic compound gas and $NH_3$ are introduced with carrier gas in the growth chamber. For instance, $Ga(CH_3)_3$, $In(CH_3)_3$, $Al(CH_3)_3$, $NH_3$, and the like may be used as the reaction gas. The reaction gases are introduced at a predetermined temperature, e.g., 700°to 1050° C. together with the carrier gas such as hydrogen or nitrogen. In this manner, GaN-based semiconductors are grown continuously from the buffer layer 101 to the second cladding layer 104. At that time, component ratios of respective layers can be controlled by changing respective component rates in the reaction gas. In addition, monosilane ($SiH_4$), biscyclopentadienylmagnesium ($CP_2Mg$), or the like is introduced appropriately in order to dope impurity into the semiconductor layers.

(c) Thereafter, the sapphire substrate 99 on which the epitaxial sapphire film 100 is grown is got out from the reaction chamber of the CVD furnace. And electrode material such as ITO, $SnO_2$, Ti, Al, Ni is deposited on the top surface of the second cladding layer 104 by sputtering, vacuum evaporation, or CVD method, as shown in FIG. 3B, thereby forming the upper electrode 105.

Figure 3C:
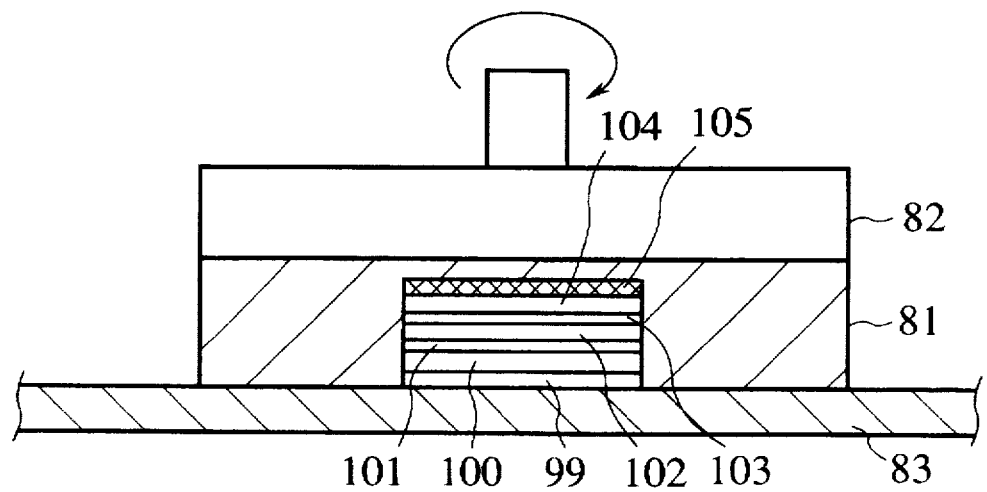

(d) As shown in FIG.3C, the sapphire substrate 99 is then secured to a polishing jig 82 by a wax 81. Then preparing a polishing cloth 83 on a glass substrate, then water is poured over the polishing cloth 83, and then abrasive is spread on the polishing cloth 83. A particle size of the abrasive is about from #2000 to #4000. While rotating the polishing jig 82, the sapphire substrate which has been secured to the polishing jig (holder) 82 is polished. This polishing operation is finished when the sapphire substrate 99 is removed by polishing to expose the epitaxial sapphire film 100.

Figure 3D:
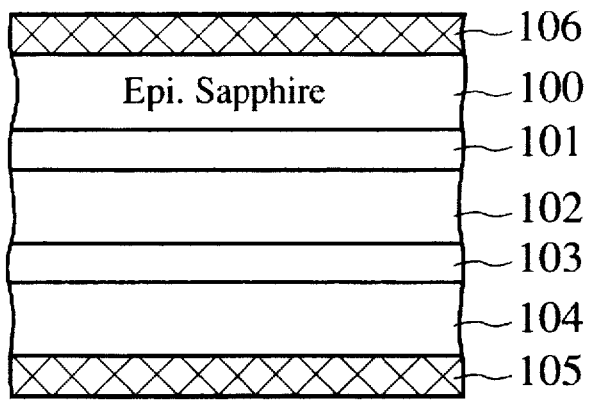

(e) Subsequently, the laminated layers 100 to 105 are detached from the polishing jig 82. After removing the wax 81 from the substrate, and cleaned by washing, it is placed in the metal deposition chamber. As shown in FIG. 3D, the metal 106 such as Ti, Al, or Ni is deposited as a lower electrode by sputtering, vacuum evaporation, or CVD on a bottom surface of the sapphire film 100 exposed.

Figure 3E:
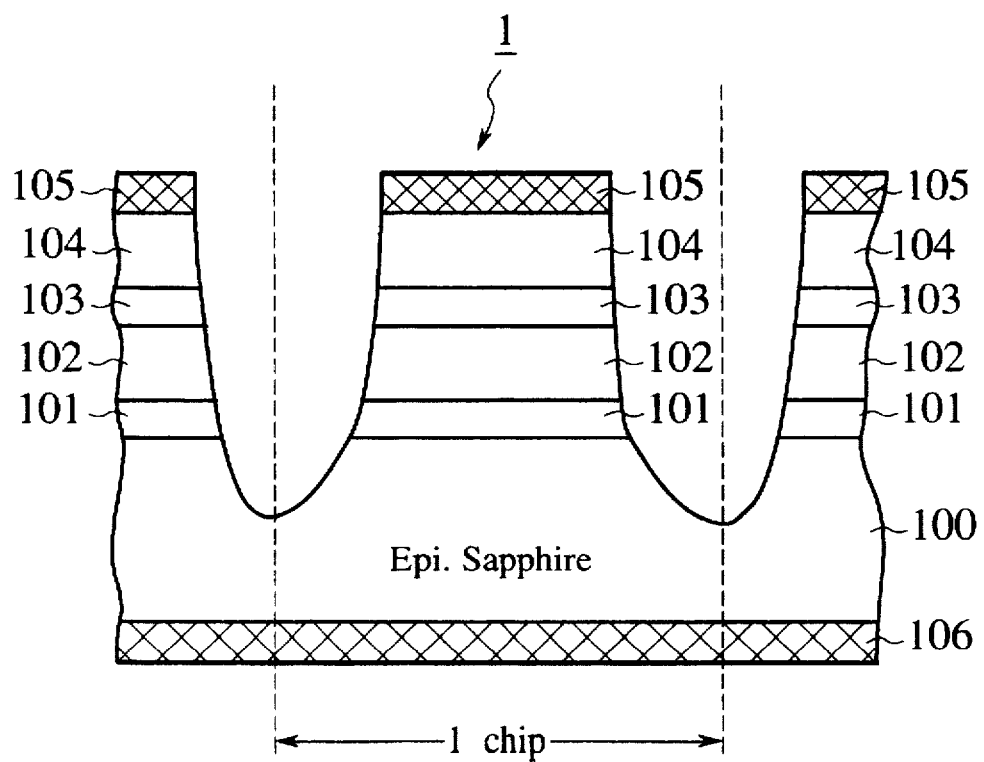

(f) As shown in FIG. 3E, mesa etching for forming scribing lines is effected to prepare for dicing step. Since characteristics of the semiconductor are badly affected by cutting off when the substrate on which the laminated structure of GaN-based semiconductors are formed is cut off into a plurality of chips, trenches for dicing are provided in the laminated structure of GaN-based semiconductors by "mesa etching" in advance. This "mesa etching" is the etching conducted generally as mesa type semiconductor devices. More particularly, the buffer layer 101, the n-type cladding layer 102, the active layer 103, the p-type cladding layer 104, and the upper electrode 105 are partially removed by etching along the scribing lines to be cut. In addition, part of the epitaxial sapphire film 100 may be removed.

Figure 4:
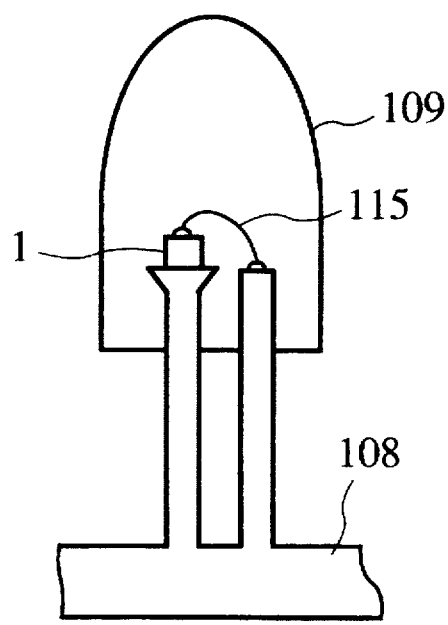
FIG. 4 is a view showing a step of assembling the GaN-based blue light-emitting diode according to the present invention.

(g) Finally, as shown in FIG. 4, a step of assembling the GaN-based compound semiconductor blue LED according to the present invention is effected. After mesa etching, the laminated structure of the GaN-based semiconductor and metal electrode formed on the sapphire substrate, which is formed as a wafer, are cut off into a plurality of chips 1 having appropriate size by the diamond cutter, etc. After cutting-off, respective chips 1 are then mounted on the wire frames 108. Bonding wires 115 are wire-bonded to the upper electrodes, and then the resultant structure is molded by molding 109. In the end, the two-terminal blue LED of the present invention can be finished by removing unnecessary portions of the wire frames 108.

In the above steps, since it is probable that, upon cutting off the chips 1, the semiconductors adjacent to the cut-off areas are damaged by cutting-off to affect light emission badly, edge portions are removed by mesa etching, as shown in FIG. 3E. However, such mesa etching can be omitted as the case may be. Nevertheless, it is preferable to form the chips 1 as mesa type semiconductor chips.

As the method of forming the sapphire film serving as the substrate 100, various bulk crystal growth methods such as Czochralski method and others may be used in addition to the above CVD method. Namely, the sapphire crystal may be prepared by various bulk crystal growth techniques, for example, (i) a Czochralski method; i.e., a seed crystal is inserted into a solution in a crucible, and the seed crystal is pulled up vertically while rotating the crystal, (ii) a capillary method; i.e., a die is set in the crucible, then the seed crystal is connected to the solution which rises based on capillary phenomenon, and then the seed crystal is pulled up with controlling a shape of the crystal by upper edges of the die, (iii) a flame melting method; i.e., micro powders of the material are melted in oxyhydrogen flame, and crystal is grown by accumulating on the seed crystal on a refractory bar, and (iv) a heat exchanger method; i.e., the seed crystal is arranged on the center of the crucible, then the crucible is set on a heat exchanger, then the material is heated and melted while cooling the seed crystal, and then crystal is grown by cooling gradually.

The n-type conductivity bulk crystal can be obtained by introducing the element in group IV, e.g., C, Si, Ge, Sn, or Pb as impurity upon growing the bulk crystal by the above method (i) to (iv). On the other hand, the p-type conductivity bulk crystal can be obtained by introducing the element in group II , e.g., Be, Mg, Ca, Sr, Ba, Ra, Zn, Cd, or Hg as impurity. After growing the bulk crystal, the resultant crystal ingot is sliced up to have a thickness of 250 to 450 μm, thereby completing the substrate 100 of the present invention. In this case, polishing step in the above (c) can be omitted. In particular, in place of the steps explained with reference to FIGS. 3A to 3C, the $In_xAl_yGa_{1-x-y}N$ layers acting respectively as the buffer layer 101, the n-type cladding layer 102, the active layer 103, and the p-type cladding layer 104 are grown directly on the sapphire substrate 100 by atmospheric pressure MOCVD method. And after that, the lower electrode layer 106 may be just formed on an opposite surface which is opposite to the surface on which these layers are grown, omitting the polishing step. And it is preferable to form a GaN-based contact layer between the upper metal electrode layer 105 and the second cladding layer 104. Because the characteristics of the blue-LED such as light-emitting efficiency can be improved by the low ohmic contact due to the GaN-based contact layer.

The materials for the conductive substrate is not limited to sapphire, but other suitable conductive substrates may be used if they are congenial to the GaN-based semiconductor. For example, there are compound semiconductors such as SiC, GaN, InN, AlN, GaAs, ZnSe, etc. and metal oxides such as ZnO, etc. as such substrate materials.

Various modifications will become possible for those skilled in the art after receiving the teachings of the present disclosure without departing from the scope thereof. As has been explained above, according to the GaN-based compound semiconductor blue light-emitting device of the present invention, luminous wavelength and luminous efficiency can be brought into their optimal states by adjusting component ratios of four kinds of element included, without crystal defect due to lattice mismatching. Further, according to the GaN-based compound semiconductor blue light emitting device of the present invention, manufacturing steps may be very simplified because of one wire bonding per a device. Furthermore, according to the GaN-based compound semiconductor blue light emitting device of the present invention, optical integrated circuits can be facilitated readily with high integration density since only one contact portion for extending electrode is needed on an upper surface of one chip.

What is claimed is:

1. A light emitting device comprising:
   (a) a conductive sapphire substrate having a resistivity of less than 1 Ω-cm;
   (b) a buffer layer formed of a first conductivity type $In_xAl_yGa_{1-x-y}N$ having mole fraction values x, y selected as $0 \leq x \leq 0.5$, $0.5 \leq y \leq 1$, $x+y \leq 1$ formed on the top surface of said conductive sapphire substrate;
   (c) a first cladding layer formed of said first conductivity type $In_xAl_yGa_{1-x-y}N$ having mole fraction values x, y selected as $0 \leq x \leq 0.3$, $0.1 \leq y \leq 1.0$ and $x+y \leq 1$ formed on said buffer layer;
   (d) an active layer formed of substantially intrinsic $In_xAl_yGa_{1-x-y}N$ having mole fraction values x, y selected as $0 \leq x \leq 0.6$, $0 \leq y \leq 0.5$, and $x+y \leq 1$ formed on said first cladding layer;
   (e) a second cladding layer formed of a second conductivity type $In_xAl_yGa_{1-x-y}N$ having mole fraction values x, y selected as $0 \leq x \leq 0.3$, $0.1 \leq y \leq 1.0$ and $x+y \leq 1$ formed on said active layer, said second conductivity type being opposite to said first conductivity type;
   (f) a transparent electrode layer formed on said second cladding layer;
   (g) a metal electrode layer formed beneath the bottom surface of said conductive sapphire substrate.

2. The device of claim 1, wherein said conductive sapphire substrate is doped with at least an impurity selected from the group consisting of C, Si, Ge, Sn and Pb.

3. The device of claim 1, further comprising:
   a contact layer formed of a second conductivity type $In_xAl_yGa_{1-x-y}N$ layer ($0.5 \leq x \leq 1.0$, $0.0 \leq y \leq 0.1$) formed on said second cladding layer.

4. The device of claim 1, further comprising:
   a contact layer formed of a first conductivity type $In_xAl_yGa_{1-x-y}N$ layer ($0.5 \leq x \leq 1.0$, $0.0 \leq y \leq 0.1$) formed beneath said conductive substrate.

5. The device of claim 2, wherein said impurity is an element doped during epitaxial growth of the conductive sapphire substrate.

6. The device of claim 1, wherein said transparent electrode layer is an ITO film.

7. The device of claim 1, wherein said transparent electrode layer is a thin metal film.

8. The device of claim 6, further comprising:
   a contact layer formed of a second conductivity type $In_xAl_yGa_{1-x-y}N$ layer formed between said second cladding layer and said ITO film.

9. The device of claim 7, further comprising:
   a contact layer formed of a second conductivity type $In_xAl_yGa_{1-x-y}N$ layer formed between said second cladding layer and said thin metal film.

10. The device of claim 1, wherein said buffer layer is metallurgically contacted with said conductive sapphire substrate.

11. The device of claim 1, wherein said conductive sapphire substrate is doped with at least an impurity selected from the group consisting of Be, Mg, Ca, Sr, Ba, Ra, Zn, Cd and Hg.

12. The device of claim 11, wherein the conductive sapphire substrate is doped with said impurity during epitaxial growth.

13. The device of claim 1, wherein respective mole fraction values x, y in said $In_xAl_yGa_{1-x-y}N$ are selected as $0<x \leq 0.5$, $0.5 \leq y \leq 1$ in said buffer layer, $0<x \leq 0.3$, $0.1 \leq y \leq 1$ in said first cladding layer, $0<x \leq 0.6$, $0 \leq y \leq 0.5$ in said active layer, and $0<x \leq 0.3$, $0.1 \leq y \leq 1.0$ in said second cladding layer.

* * * * *

UNITED STATES PATENT AND TRADEMARK OFFICE
CERTIFICATE OF CORRECTION

PATENT NO.   : 5,798,537
DATED        : August 25, 1998
INVENTOR(S)  : NITTA

It is certified that error appears in the above-indentified patent and that said Letters Patent is hereby corrected as shown below:

Claim 1, column 8, line 13, after "layer;" insert --and--.

Signed and Sealed this

Twenty-seventh Day of July, 1999

Attest:

Q. TODD DICKINSON

*Attesting Officer*            *Acting Commissioner of Patents and Trademarks*